(12) United States Patent
Huynh et al.

(10) Patent No.: US 9,154,027 B2
(45) Date of Patent: Oct. 6, 2015

(54) DYNAMIC LOAD MATCHING CHARGE PUMP FOR REDUCED CURRENT CONSUMPTION

(71) Applicant: SanDisk Technologies Inc., Plano, TX (US)

(72) Inventors: Jonathan Huynh, San Jose, CA (US); Steve Choi, Danville, CA (US); Jongmin Park, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/101,180

(22) Filed: Dec. 9, 2013

(65) Prior Publication Data

US 2015/0162825 A1    Jun. 11, 2015

(51) Int. Cl.
 *H02M 3/07*    (2006.01)
(52) U.S. Cl.
 CPC ...................................... *H02M 3/07* (2013.01)
(58) Field of Classification Search
 CPC ................................ H02M 3/07; H02M 3/073
 See application file for complete search history.

(56) References Cited

U.S. PATENT DOCUMENTS

| | | | |
|---|---|---|---|
| 3,697,860 A | 10/1972 | Baker | |
| 4,271,461 A | 6/1981 | Hoffmann et al. | |
| 4,511,811 A | 4/1985 | Gupta | |
| 4,583,157 A | 4/1986 | Kirsch et al. | |
| 4,621,315 A | 11/1986 | Vaughn et al. | |
| 4,636,748 A | 1/1987 | Latham | |
| 4,736,121 A | 4/1988 | Cini et al. | |
| 4,888,738 A | 12/1989 | Wong et al. | |
| 5,140,182 A | 8/1992 | Ichimura | |
| 5,168,174 A | 12/1992 | Naso et al. | |
| 5,175,706 A | 12/1992 | Edme | |
| 5,263,000 A | 11/1993 | Van Buskirk et al. | |
| 5,335,198 A | 8/1994 | Van Buskirk et al. | |
| 5,392,205 A | 2/1995 | Zavaleta | |
| 5,432,469 A | 7/1995 | Tedrow et al. | |
| 5,436,587 A | 7/1995 | Cernea | |
| 5,483,434 A | 1/1996 | Seesink | |
| 5,508,971 A | 4/1996 | Cernea et al. | |
| 5,521,547 A | 5/1996 | Tsukada | |
| 5,532,653 A * | 7/1996 | Adkins | 331/143 |
| 5,539,351 A | 7/1996 | Gilsdorf et al. | |

(Continued)

FOREIGN PATENT DOCUMENTS

| | | |
|---|---|---|
| CN | 101764518 A | 6/2010 |
| CN | 101902059 | 12/2010 |

(Continued)

OTHER PUBLICATIONS

U.S. Appl. No. 12/973,641, filed Dec. 20, 2010, 26 pages.

(Continued)

*Primary Examiner* — Thomas J Hiltunen
(74) *Attorney, Agent, or Firm* — Davis Wright Tremaine LLP

(57) ABSTRACT

A charge pump is regulated based up its output level. The regulation circuitry adjusts the frequency of the pump's clock based on feedback from pump's output. The pump's clock signal is generated by an oscillator whose frequency depends on a reference voltage level. The reference voltage level is dependent upon a regulation signal. In an example, a transistor whose gate is controlled by the regulation level is part of a series of elements in voltage divider, where the reference value is taken from a node of the divider.

18 Claims, 4 Drawing Sheets

(56) References Cited

U.S. PATENT DOCUMENTS

| | | | |
|---|---|---|---|
| 5,553,030 A * | 9/1996 | Tedrow et al. ............... 365/226 |
| 5,563,779 A | 10/1996 | Cave et al. |
| 5,563,825 A | 10/1996 | Cernea et al. |
| 5,568,424 A | 10/1996 | Cernea et al. |
| 5,570,315 A | 10/1996 | Tanaka et al. |
| 5,592,420 A | 1/1997 | Cernea et al. |
| 5,596,532 A | 1/1997 | Cernea et al. |
| 5,602,794 A | 2/1997 | Javanifard et al. |
| 5,621,685 A | 4/1997 | Cernea et al. |
| 5,625,544 A | 4/1997 | Kowshik et al. |
| 5,644,534 A | 7/1997 | Soejima |
| 5,693,570 A | 12/1997 | Cernea et al. |
| 5,712,778 A | 1/1998 | Moon |
| 5,732,039 A | 3/1998 | Javanifard et al. |
| 5,734,286 A | 3/1998 | Takeyama et al. |
| 5,767,735 A | 6/1998 | Javanifard et al. |
| 5,781,473 A | 7/1998 | Javanifard et al. |
| 5,801,987 A | 9/1998 | Dinh |
| 5,812,017 A | 9/1998 | Golla et al. |
| 5,818,766 A * | 10/1998 | Song ................ 365/189.11 |
| 5,828,596 A | 10/1998 | Takata et al. |
| 5,903,495 A | 5/1999 | Takeuchi et al. |
| 5,943,226 A | 8/1999 | Kim |
| 5,945,870 A | 8/1999 | Chu et al. |
| 5,969,565 A | 10/1999 | Naganawa |
| 5,969,988 A | 10/1999 | Tanzawa et al. |
| 5,973,546 A | 10/1999 | Le et al. |
| 5,982,222 A | 11/1999 | Kyung |
| 6,008,690 A | 12/1999 | Takeshima et al. |
| 6,016,073 A | 1/2000 | Ghilardelli et al. |
| 6,018,264 A | 1/2000 | Jin |
| 6,023,187 A | 2/2000 | Camacho et al. |
| 6,026,002 A | 2/2000 | Viehmann |
| 6,046,935 A | 4/2000 | Takeuchi et al. |
| 6,104,225 A | 8/2000 | Taguchi et al. |
| 6,107,862 A | 8/2000 | Mukainakano et al. |
| 6,134,145 A | 10/2000 | Wong |
| 6,147,566 A * | 11/2000 | Pizzuto et al. ............... 331/111 |
| 6,151,229 A | 11/2000 | Taub et al. |
| 6,154,088 A | 11/2000 | Chevallier et al. |
| 6,157,242 A | 12/2000 | Fukui |
| 6,188,590 B1 | 2/2001 | Chang et al. |
| 6,198,645 B1 | 3/2001 | Kotowski et al. |
| 6,208,198 B1 | 3/2001 | Lee |
| 6,249,445 B1 | 6/2001 | Sugasawa |
| 6,249,898 B1 | 6/2001 | Koh et al. |
| 6,275,096 B1 | 8/2001 | Hsu et al. |
| 6,278,294 B1 * | 8/2001 | Taniguchi .................. 326/80 |
| 6,285,622 B1 | 9/2001 | Haraguchi et al. |
| 6,288,601 B1 | 9/2001 | Tomishima |
| 6,297,687 B1 | 10/2001 | Sugimura |
| 6,307,425 B1 | 10/2001 | Chevallier et al. |
| 6,314,025 B1 | 11/2001 | Wong |
| 6,320,428 B1 | 11/2001 | Atsumi et al. |
| 6,320,796 B1 | 11/2001 | Voo et al. |
| 6,320,797 B1 | 11/2001 | Liu |
| 6,329,869 B1 | 12/2001 | Matano |
| 6,344,959 B1 | 2/2002 | Milazzo |
| 6,344,984 B1 | 2/2002 | Miyazaki |
| 6,356,062 B1 * | 3/2002 | Elmhurst et al. ............... 323/282 |
| 6,356,499 B1 | 3/2002 | Banba et al. |
| 6,359,798 B1 | 3/2002 | Han et al. |
| 6,369,642 B1 | 4/2002 | Zeng et al. |
| 6,370,075 B1 | 4/2002 | Haeberli et al. |
| 6,385,107 B1 | 5/2002 | Bedarida et al. |
| 6,400,202 B1 | 6/2002 | Fifield et al. |
| 6,404,274 B1 | 6/2002 | Hosono et al. |
| 6,411,157 B1 | 6/2002 | Hsu et al. |
| 6,424,570 B1 | 7/2002 | Le et al. |
| 6,445,243 B2 | 9/2002 | Myono |
| 6,456,154 B2 * | 9/2002 | Sugimura .................. 327/537 |
| 6,456,170 B1 | 9/2002 | Segawa et al. |
| 6,476,666 B1 | 11/2002 | Palusa et al. |
| 6,486,728 B2 | 11/2002 | Kleveland |
| 6,518,830 B2 | 2/2003 | Gariboldi et al. |
| 6,522,191 B1 | 2/2003 | Cha et al. |
| 6,525,614 B2 | 2/2003 | Tanimoto |
| 6,525,949 B1 | 2/2003 | Johnson et al. |
| 6,531,792 B2 | 3/2003 | Oshio |
| 6,538,930 B2 | 3/2003 | Ishii et al. |
| 6,545,529 B2 | 4/2003 | Kim |
| 6,556,465 B2 | 4/2003 | Haeberli et al. |
| 6,577,535 B2 | 6/2003 | Pasternak |
| 6,606,267 B2 | 8/2003 | Wong |
| 6,661,682 B2 | 12/2003 | Kim et al. |
| 6,703,891 B2 | 3/2004 | Tanaka |
| 6,724,241 B1 | 4/2004 | Bedarida et al. |
| 6,734,718 B1 | 5/2004 | Pan |
| 6,737,907 B2 | 5/2004 | Hsu et al. |
| 6,760,262 B2 | 7/2004 | Haeberli et al. |
| 6,762,640 B2 | 7/2004 | Katsuhisa |
| 6,781,440 B2 | 8/2004 | Huang |
| 6,798,274 B2 | 9/2004 | Tanimoto |
| 6,819,162 B2 | 11/2004 | Pelliconi |
| 6,834,001 B2 | 12/2004 | Myono |
| 6,859,091 B1 | 2/2005 | Nicholson et al. |
| 6,878,981 B2 | 4/2005 | Eshel |
| 6,891,764 B2 | 5/2005 | Li |
| 6,894,554 B2 | 5/2005 | Ito |
| 6,922,096 B2 | 7/2005 | Cernea |
| 6,927,441 B2 | 8/2005 | Pappalardo et al. |
| 6,933,768 B2 | 8/2005 | Hausmann |
| 6,944,058 B2 | 9/2005 | Wong |
| 6,954,386 B2 | 10/2005 | Narui et al. |
| 6,975,135 B1 | 12/2005 | Bui |
| 6,985,397 B2 | 1/2006 | Tokui et al. |
| 6,990,031 B2 | 1/2006 | Hashimoto et al. |
| 6,995,603 B2 | 2/2006 | Chen et al. |
| 7,002,381 B1 | 2/2006 | Chung |
| 7,023,260 B2 | 4/2006 | Thorp et al. |
| 7,030,683 B2 | 4/2006 | Pan et al. |
| 7,092,263 B2 | 8/2006 | Chang |
| 7,113,023 B2 | 9/2006 | Cernea |
| 7,116,154 B2 | 10/2006 | Guo |
| 7,116,155 B2 | 10/2006 | Pan |
| 7,120,051 B2 | 10/2006 | Gorobets et al. |
| 7,123,078 B2 * | 10/2006 | Seo ................ 327/536 |
| 7,129,538 B2 | 10/2006 | Lee et al. |
| 7,129,759 B2 | 10/2006 | Fukami |
| 7,135,910 B2 | 11/2006 | Cernea |
| 7,135,911 B2 | 11/2006 | Imamiya |
| 7,180,794 B2 * | 2/2007 | Matsue ................ 365/189.09 |
| 7,205,682 B2 | 4/2007 | Kuramori |
| 7,208,996 B2 | 4/2007 | Suzuki et al. |
| 7,215,179 B2 | 5/2007 | Yamazoe et al. |
| 7,224,591 B2 | 5/2007 | Kaishita et al. |
| 7,227,780 B2 | 6/2007 | Komori et al. |
| 7,239,192 B2 | 7/2007 | Tailliet |
| 7,253,675 B2 | 8/2007 | Aksin et al. |
| 7,253,676 B2 | 8/2007 | Fukuda et al. |
| 7,259,612 B2 | 8/2007 | Saether |
| 7,276,960 B2 | 10/2007 | Peschke |
| 7,279,957 B2 | 10/2007 | Yen |
| 7,345,928 B2 | 3/2008 | Li |
| 7,368,979 B2 | 5/2008 | Govindu et al. |
| 7,397,677 B1 | 7/2008 | Collins et al. |
| 7,466,188 B2 | 12/2008 | Fifield |
| 7,468,628 B2 | 12/2008 | Im et al. |
| 7,495,500 B2 | 2/2009 | Al-Shamma et al. |
| 7,521,978 B2 | 4/2009 | Kim et al. |
| 7,545,684 B2 * | 6/2009 | Nakagawa et al. ......... 365/189.09 |
| 7,554,311 B2 | 6/2009 | Pan |
| 7,579,902 B2 | 8/2009 | Frulio et al. |
| 7,579,903 B2 | 8/2009 | Oku |
| 7,602,233 B2 | 10/2009 | Pietri et al. |
| 7,667,529 B2 * | 2/2010 | Consuelo et al. ............. 327/536 |
| 7,671,572 B2 | 3/2010 | Chung |
| 7,696,812 B2 | 4/2010 | Al-Shamma et al. |
| 7,772,914 B2 | 8/2010 | Jung |
| 7,795,952 B2 | 9/2010 | Lui et al. |
| 7,830,203 B2 | 11/2010 | Chang et al. |
| 7,928,796 B2 * | 4/2011 | Namekawa ................ 327/537 |
| 7,944,277 B1 * | 5/2011 | Sinitsky et al. ............ 327/536 |
| 7,956,675 B2 * | 6/2011 | Saitoh et al. ............... 327/536 |

(56) References Cited

U.S. PATENT DOCUMENTS

| | | | |
|---|---|---|---|
| 8,040,174 B2 | 10/2011 | Likhterov | |
| 8,040,184 B2 | 10/2011 | Tsuchiya | |
| 8,093,953 B2 | 1/2012 | Pierdomenico et al. | |
| 8,159,091 B2 | 4/2012 | Yeates | |
| 8,193,853 B2 | 6/2012 | Hsieh et al. | |
| 8,242,834 B2 | 8/2012 | Chuang et al. | |
| 8,339,183 B2 | 12/2012 | Htoo et al. | |
| 8,395,440 B2 | 3/2013 | Sandhu et al. | |
| 8,604,868 B2 | 12/2013 | Ucciardello et al. | |
| 8,643,358 B2* | 2/2014 | Yoon | 324/76.11 |
| 2002/0008566 A1 | 1/2002 | Taito et al. | |
| 2002/0014908 A1 | 2/2002 | Lauterbach | |
| 2002/0075063 A1* | 6/2002 | Hwang | 327/536 |
| 2002/0075706 A1 | 6/2002 | Foss et al. | |
| 2002/0101744 A1 | 8/2002 | DeMone | |
| 2002/0130701 A1 | 9/2002 | Kleveland | |
| 2002/0130704 A1 | 9/2002 | Myono et al. | |
| 2002/0140463 A1 | 10/2002 | Cheung | |
| 2002/0163376 A1 | 11/2002 | Pappalardo et al. | |
| 2003/0128560 A1 | 7/2003 | Saiki et al. | |
| 2003/0214346 A1 | 11/2003 | Pelliconi | |
| 2004/0046603 A1 | 3/2004 | Bedarida et al. | |
| 2005/0024125 A1 | 2/2005 | McNitt et al. | |
| 2005/0030088 A1 | 2/2005 | Cernea | |
| 2005/0093614 A1 | 5/2005 | Lee | |
| 2005/0195017 A1 | 9/2005 | Chen et al. | |
| 2005/0237103 A1 | 10/2005 | Cernea | |
| 2005/0248386 A1 | 11/2005 | Pan et al. | |
| 2006/0098505 A1 | 5/2006 | Cho et al. | |
| 2006/0114053 A1 | 6/2006 | Sohara et al. | |
| 2006/0119393 A1 | 6/2006 | Hua et al. | |
| 2006/0244518 A1 | 11/2006 | Byeon et al. | |
| 2006/0250177 A1 | 11/2006 | Thorp et al. | |
| 2007/0001745 A1 | 1/2007 | Yen | |
| 2007/0053216 A1 | 3/2007 | Alenin | |
| 2007/0069805 A1 | 3/2007 | Choi et al. | |
| 2007/0126494 A1 | 6/2007 | Pan | |
| 2007/0139099 A1 | 6/2007 | Pan | |
| 2007/0139100 A1 | 6/2007 | Pan | |
| 2007/0152738 A1* | 7/2007 | Stopel et al. | 327/538 |
| 2007/0210853 A1 | 9/2007 | Maejima | |
| 2007/0211502 A1 | 9/2007 | Komiya | |
| 2007/0222498 A1 | 9/2007 | Choy et al. | |
| 2007/0229149 A1 | 10/2007 | Pan et al. | |
| 2008/0012627 A1 | 1/2008 | Kato | |
| 2008/0024096 A1 | 1/2008 | Pan | |
| 2008/0024198 A1* | 1/2008 | Bitonti et al. | 327/536 |
| 2008/0042731 A1 | 2/2008 | Daga et al. | |
| 2008/0068067 A1 | 3/2008 | Govindu et al. | |
| 2008/0111604 A1 | 5/2008 | Boerstler et al. | |
| 2008/0116963 A1 | 5/2008 | Jung | |
| 2008/0136500 A1 | 6/2008 | Frulio et al. | |
| 2008/0157731 A1 | 7/2008 | Pan | |
| 2008/0157852 A1 | 7/2008 | Pan | |
| 2008/0157859 A1 | 7/2008 | Pan | |
| 2008/0218134 A1 | 9/2008 | Kawakami | |
| 2008/0239802 A1 | 10/2008 | Thorp | |
| 2008/0239856 A1 | 10/2008 | Thorp | |
| 2008/0278222 A1 | 11/2008 | Conte et al. | |
| 2008/0307342 A1 | 12/2008 | Furches et al. | |
| 2009/0033306 A1 | 2/2009 | Tanzawa | |
| 2009/0051413 A1 | 2/2009 | Chu et al. | |
| 2009/0058506 A1 | 3/2009 | Nandi et al. | |
| 2009/0058507 A1 | 3/2009 | Nandi et al. | |
| 2009/0063918 A1 | 3/2009 | Chen et al. | |
| 2009/0091366 A1 | 4/2009 | Baek et al. | |
| 2009/0121780 A1 | 5/2009 | Chen et al. | |
| 2009/0121782 A1* | 5/2009 | Oyama et al. | 327/536 |
| 2009/0153230 A1 | 6/2009 | Pan et al. | |
| 2009/0153231 A1 | 6/2009 | Pan et al. | |
| 2009/0153232 A1 | 6/2009 | Fort et al. | |
| 2009/0167418 A1 | 7/2009 | Raghavan | |
| 2009/0174441 A1 | 7/2009 | Gebara et al. | |
| 2009/0184697 A1 | 7/2009 | Park | |
| 2009/0219077 A1 | 9/2009 | Pietri et al. | |
| 2009/0315598 A1 | 12/2009 | Namekawa | |
| 2009/0315616 A1 | 12/2009 | Nguyen et al. | |
| 2009/0322413 A1 | 12/2009 | Huynh et al. | |
| 2010/0019832 A1 | 1/2010 | Pan | |
| 2010/0033232 A1 | 2/2010 | Pan | |
| 2010/0074034 A1 | 3/2010 | Cazzaniga | |
| 2010/0085794 A1 | 4/2010 | Chen et al. | |
| 2010/0118625 A1 | 5/2010 | Matano | |
| 2010/0127761 A1 | 5/2010 | Matano | |
| 2010/0244935 A1 | 9/2010 | Kim et al. | |
| 2010/0283549 A1 | 11/2010 | Wang | |
| 2010/0302877 A1 | 12/2010 | Bang | |
| 2011/0026329 A1 | 2/2011 | Wada | |
| 2011/0133821 A1 | 6/2011 | Honda | |
| 2011/0148509 A1 | 6/2011 | Pan | |
| 2011/0156803 A1 | 6/2011 | Yap et al. | |
| 2011/0176370 A1 | 7/2011 | Izumi et al. | |
| 2011/0254615 A1 | 10/2011 | Raghunathan et al. | |
| 2012/0230071 A1* | 9/2012 | Kaneda | 363/59 |
| 2012/0274394 A1 | 11/2012 | Chan | |
| 2013/0162229 A1 | 6/2013 | Chan | |
| 2013/0181521 A1 | 7/2013 | Khlat | |
| 2014/0085985 A1 | 3/2014 | Pan et al. | |
| 2014/0375293 A1 | 12/2014 | Pan et al. | |

FOREIGN PATENT DOCUMENTS

| | | |
|---|---|---|
| DE | 10 2007 02629 | 7/2008 |
| EP | 0 382 929 A | 8/1990 |
| EP | 0 780 515 A | 6/1997 |
| JP | 2007-020268 | 1/2007 |
| WO | 01/06336 A1 | 1/2001 |
| WO | WO 2006/132757 | 12/2006 |

OTHER PUBLICATIONS

U.S. Appl. No. 12/973,493, filed Dec. 20, 2010, 28 pages.

U.S. Appl. No. 13/228,605, filed Sep. 9, 2011, 21 pages.

Louie Pylarinos et al., "Charge Pumps: An Overview", Department of Electrical and Computer Engineering University of Toronto, 7 pages.

Ang et al., "An On-Chip Voltage Regulator Using Switched Decoupling Capacitors," 2000 IEEE International Solid-State Circuits Conference, 2 pages.

U.S. Appl. No. 12/506,998 entitled "Charge Pump with Current Based Regulation" filed Jul. 21, 2009, 21 pages.

U.S. Appl. No. 12/634,385 entitled "Multi-Stage Charge Pump with Variable Number of Boosting Stages" filed Dec. 9, 2009, 33 pages.

Notice of Allowance in U.S. Appl. No. 13/926,442, mailed May 13, 2015, 9 pages.

First Office Action issued for Chinese Patent Application No. 201180061403.1 mailed on Feb. 3, 2015, 4 pages.

* cited by examiner

Charging Half Cycle

Transfer Half Cycle

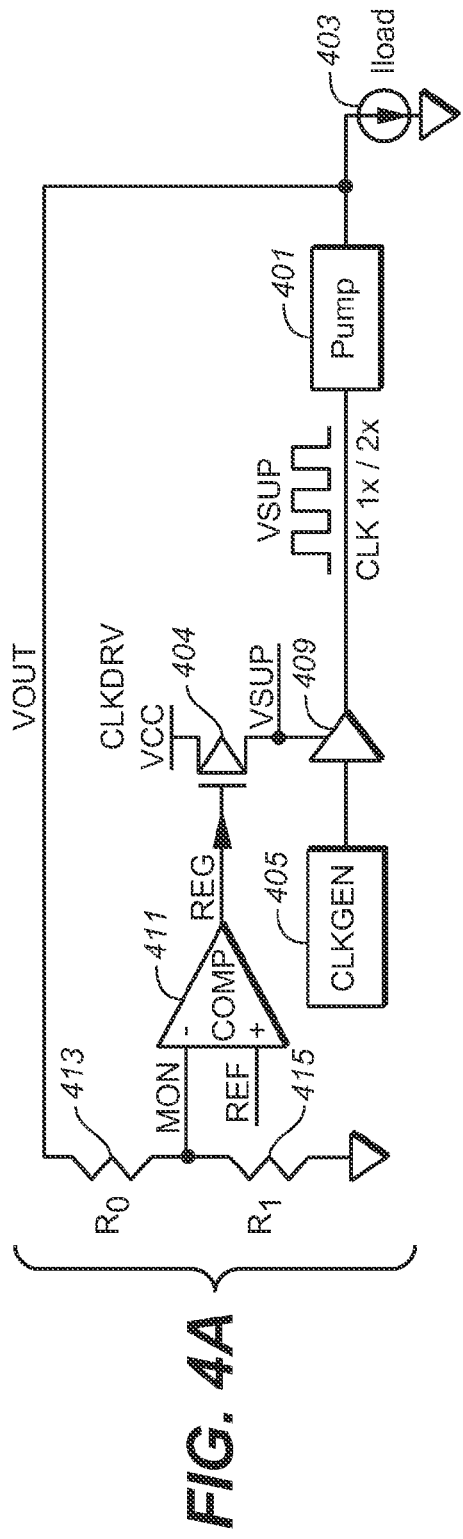
*FIG. 4A*
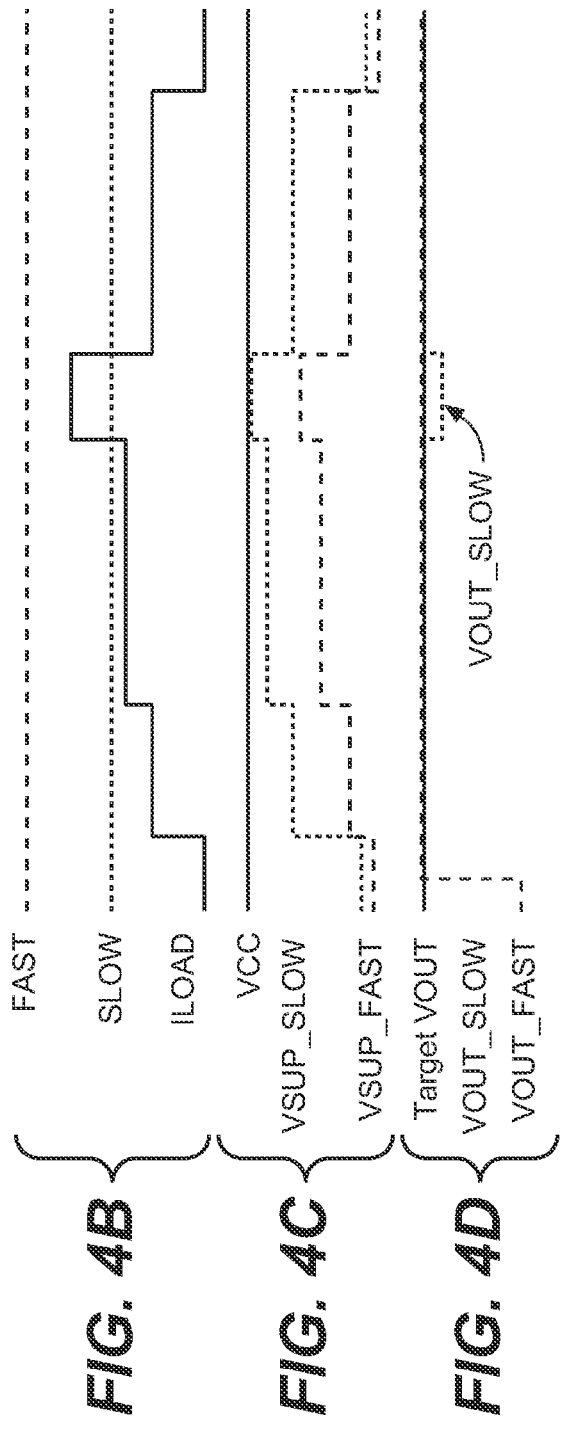
*FIG. 4B*
*FIG. 4C*
*FIG. 4D*

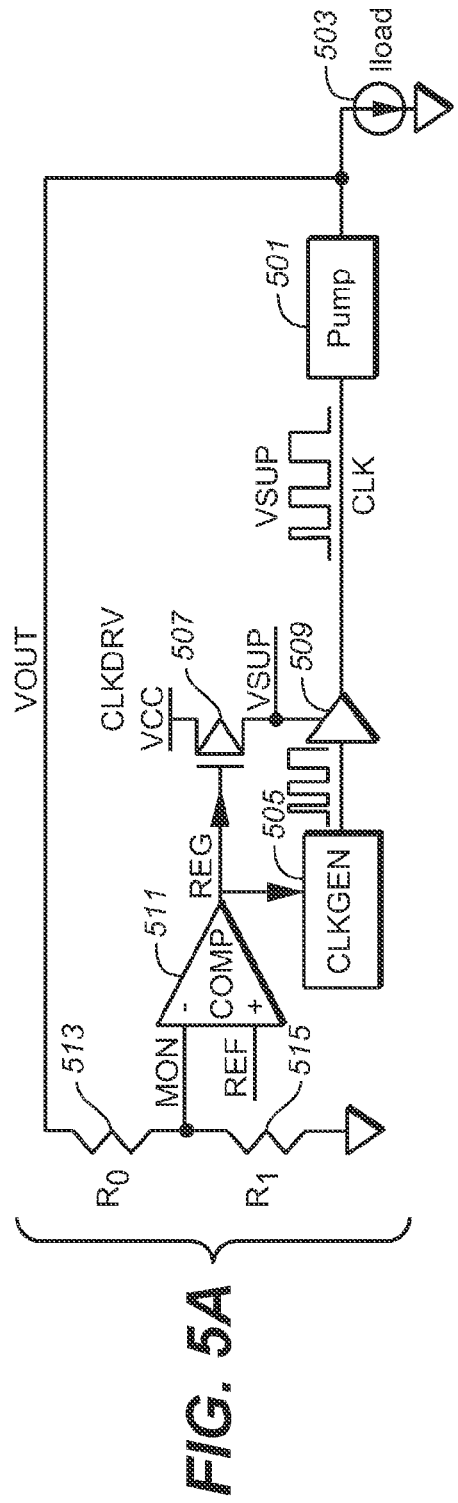
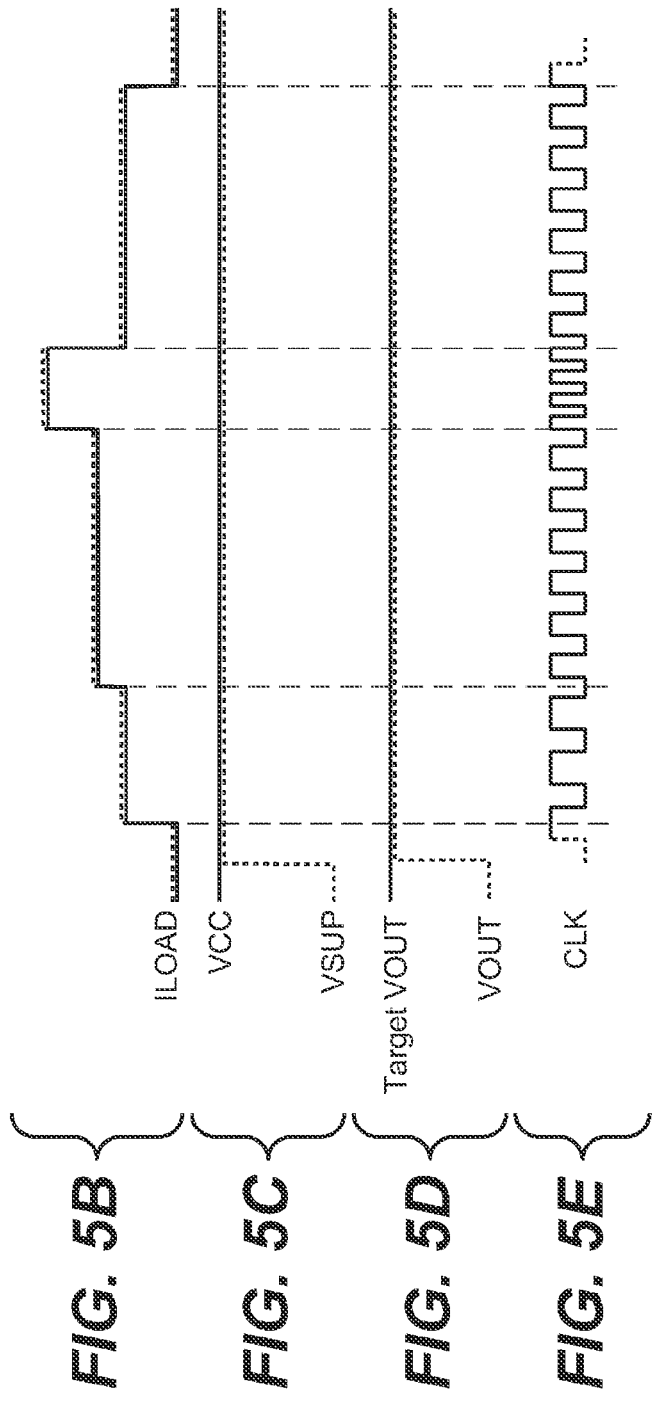
FIG. 5A
FIG. 5B
FIG. 5C
FIG. 5D
FIG. 5E

DYNAMIC LOAD MATCHING CHARGE PUMP FOR REDUCED CURRENT CONSUMPTION

FIELD OF THE INVENTION

This invention pertains generally to the field of charge pumps and more particularly to techniques for regulating charge pumps.

BACKGROUND

Charge pumps use a switching process to provide a DC output voltage larger or lower than its DC input voltage. In general, a charge pump will have a capacitor coupled to switches between an input and an output. During one clock half cycle, the charging half cycle, the capacitor couples in parallel to the input so as to charge up to the input voltage. During a second clock cycle, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2*V_{IN}$ with respect to ground.

Charge pumps are used in many contexts. For example, they are used as peripheral circuits on flash and other non-volatile memories to generate many of the needed operating voltages, such as programming or erase voltages, from a lower power supply voltage. A number of charge pump designs, such as conventional Dickson-type pumps, are known in the art. But given the common reliance upon charge pumps, there is an ongoing need for improvements in pump design, particularly with respect to trying to save on current consumption.

SUMMARY OF THE INVENTION

A charge pump circuit system includes a charge pump circuit connected to receive a clock signal and generate from it an output voltage and regulation circuitry connected to receive the output voltage and generate a regulation signal based on the output voltage. The charge pump system also includes a clock generation circuit to generate the clock signal, where the clock generation circuit includes an oscillator and a reference voltage generating circuit. The oscillator is connected to receive a reference voltage and generate from it the clock signal, wherein the frequency of the clock signal is dependent upon the level of the reference voltage. The reference voltage generating circuit is connected to receive the regulation signal and generate from it the reference voltage, wherein the level of the reference voltage is dependent upon the regulation signal.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which:

FIGS. 4A-D look at the regulation of a charge pump using a fixed pump clock value;

FIGS. 5A-E look at the regulation of a charge pump using a pump clock value that can be varied continuously by the regulation circuitry based on feedback from the pump's output.

DETAILED DESCRIPTION

Charge pumps are often operating in a low efficient region. To maintain small ripple, amplitude control can be used to match charge pump's drivability to its load; and to handle the worst case loading condition, charge pumps are often operating in a low efficient region where pump's full strength drivability and its load are greatly mismatched. DC-DC converters such as charge pumps are typically optimized for power efficiency for the supplying large load currents. For example, on a non-volatile memory system this requirement is mainly related to AC capacitive current to needed charge up word lines. The efficiency of the system may drop to extremely low levels, less than 1% in some applications, after the capacitive load is charged up and the load current reduces to just what is needed due to leakage, as is the case during regulation to maintain word line voltages. Although performance requirements are based on the charging-up period, the system will typically be operating under regulation for a greater amount of time. To improve overall power efficiency, the power efficiency during regulation needs to be improved since it accounts for a significant amount of total operation time.

Figure 1A:
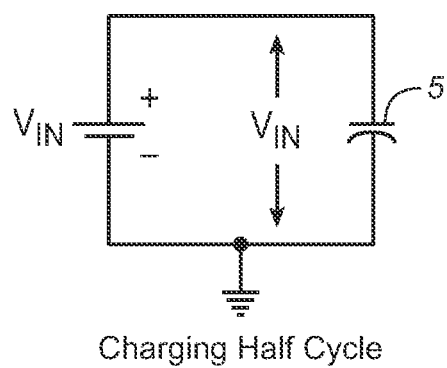
FIG. 1a is a simplified circuit diagram of the charging half cycle in a generic charge pump.
Figure 1B:
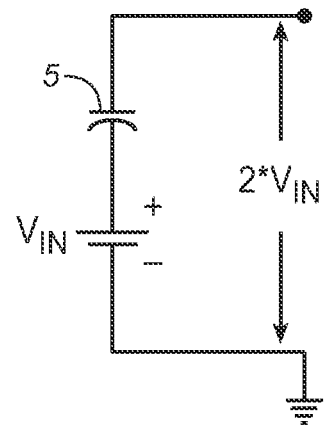
FIG. 1b is a simplified circuit diagram of the transfer half cycle in a generic charge pump.
Figure 2:
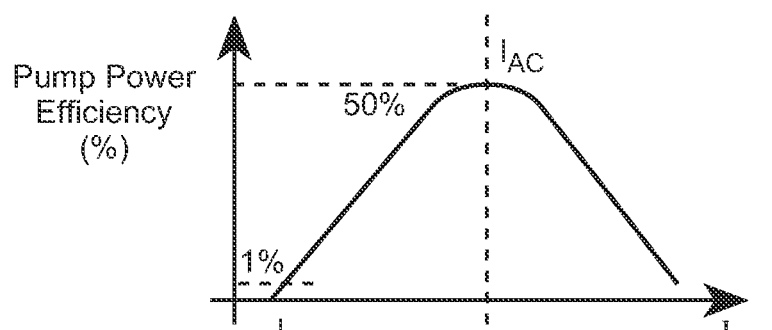
FIG. 2 illustrates the power efficiency of a charge pump system for various load levels.

FIG. 2 illustrates the efficiency of a charge pump system for various load levels. As shown, the DC-DC converter is optimized for power efficiency for the certain large load current levels, $I_{AC}$, mainly related to the main task for the pump, such as AC capacitive current to charge up word lines in a memory circuit example. Once this capacitance is charge up, the load current will reduce down to the leakage current, $I_{leakage}$, and the efficiency drops significantly, to possibly even below 1%. In the memory circuit example, $I_{leakage}$, is the level needed during regulation to maintain the word line voltage. To improve overall power efficiency for the system, power efficiency during regulation can be improved, since it accounts for a significant amount of total operation time.

The following presents techniques for maintaining a pump's output at a target value and pump strength, while power can be saved by dynamically adjust the clock frequency with full potential clock swing to match pump's driving strength to its DC load. A common application for charge pumps is in NAND flash memories that are often integrated into digital mobile devices where power consumption is one of the key features for performance. Outside of the actual memory array, charge pumps that generate supply voltage for peripheral circuits are significant power consumption blocks on the memory circuit. The pump systems presented below can help to maintain the output at a target value and pump strength while power is saved by dynamically adjusting the clock frequency with full potential clock swing to match pump's driving strength to the load.

The following is primarily concerned with the regulation circuitry of charge pump systems rather than the details of the pump itself. For example, the pump can be based on a Dickson-type pump, voltage doublers, four-phase, and so on. More detail on various pumps and pump system within which the following concepts can be applied can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,922,096; 7,030,683; 7,554,311; 7,368,979; 7,795,952; 7,135,910; 7,973,592; and 7,969,235; US Patent Publication numbers 2009-0153230-A1; 2009-0153232-A1; 2009-0315616-A1; 2009-0322413-A1; 2009-0058506-A1; US-2011-0148509-A1; 2007-0126494-A1; 2007-0139099-A1; 2008-0307342 A1; 2009-0058507 A1; 2012-0154023; 2012-0154022; and 2013-0063118; and U.S. patent application Ser. Nos. 13/618,482; 13/628,465; 13/886,066; 13/921,072; 13/926,442; and Ser. No. 13/929,197.

Figure 3:
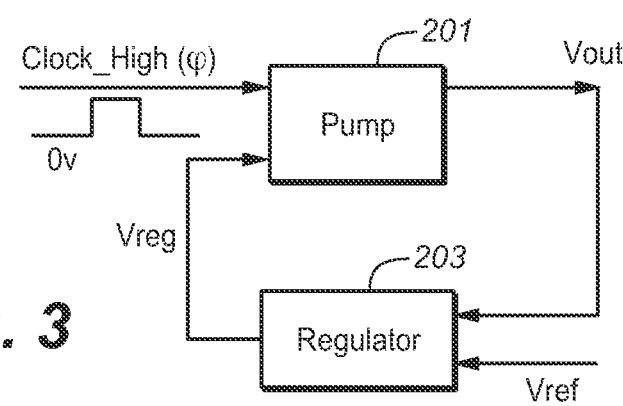
FIG. 3 is a top-level block diagram for a regulated charge pump.

With respect to regulation, FIG. 3 is a simplified top-level block diagram of a typical charge pump using an output voltage based regulation scheme. As shown in FIG. 3, the pump 201 has as inputs a clock signal and a voltage Vreg and provides an output Vout. The clock generation circuit is not explicitly shown in FIG. 3, although it may be considered part of the charge pump system in some embodiments or taken as an external input. The high (Vdd) and low (ground) connections are also not explicitly shown. The voltage Vreg is provided by the regulator 203, which has as inputs a reference voltage Vref from an external voltage source and the output voltage Vout. The regulator block 203 generates feedback control signal Vreg such that the desired value of Vout can be obtained. The pump section 201 may have any of various designs for charge pumps, such as described in the various references cited above including charge doubler-type circuits with cross-coupled elements as well as the Dickson-type pumps described below for the exemplary embodiments. (A charge pump is typically taken to refer to both the pump portion 201 and the regulator 203, when a regulator is included, although in some usages "charge pump" refers to just the pump section 201. In the following, the terminology "charge pump system" will often be used to describe pump itself as well as any regulation or other peripheral elements.) The regulator block 203 typically compares the Vref to the Vout value by using a voltage divider circuit. The voltage divider can be a resistive divider, a capacitive divider, or some combination (see, for example, U.S. Pat. No. 7,554,311).

FIGS. 4A-D look at a regulated charge pump system in more detail. The block diagram of FIG. 4A includes pump 401 driving a load represented at 403. The pump is driven by a clock signal CLK from a clock generator circuit CLKGEN 405 that is supplied through a clock driver. The clock driver CLKDRV includes the buffer 407 that is supplied at a level VSUP from the VCC level by the transistor 409. The pump 401 then receives the clock signal of amplitude VSUP. In this example the clock can be supplied with a fast (1×) and a slow (2×) period. The gate of the driver's transistor 409 is controlled by the regulation circuitry, with the output REG of the comparator 411 connected to the control gate of transistor 409. The inputs of the comparator 411 are connected to receive a reference level REF and feedback from the pump's output VOUT taken from a node of, in this example, a resistive voltage divider formed from $R_0$ 413 and $R_1$ 415.

The operation of the circuit of FIG. 4A is described with respect to FIGS. 4B-D. In FIG. 4B, ILOAD is an example of a DC load current profile; FAST is the current for the pump operating at maximum driving strength; and SLOW is the current for the pump at maximum driving strength, but at a 2 times slower clock frequency from FAST. In the arrangement of FIG. 4A, the lock frequency is usually predetermined by considering worst case loading; however, it practice it is difficult to determine the exact timing and loading for the circuit due the many different factors that enter in to load variation.

In FIG. 4C, VCC is the external supply level; VSUP_FAST is the pump clock's supply level under regulation; and VSUP_SLOW is the pump clock's supply in regulation at a twice (2×) slower clock frequency relative to FAST. Matching pump's driving strength with the load is realized by a voltage drop to the clock supply, limiting the pump's strength. This results in large inefficiencies and power loss due to voltage drop, as illustrated by the gap between VCC and the VSUP levels.

FIG. 4D illustrates the target pump output VOUT along with the realistic pump outputs VOUT_FAST and VOUT_SLOW, where the SLOW value is the pump output at a 2× slower clock frequency relative to FAST. In FIG. 4D, both of VOUT_FAST and VOUT_SLOW rise to the target level and, mostly, stay there, except that at the highest load current VOUT_SLOW drops. This reflects that by not selecting the proper clock frequency (that is, in this example by selecting SLOW instead of FAST), VOUT can be out of the specification due to the pump's strength being too weak. If it is instead selected to the have proper clock frequency (here, FAST), the pump's ability and target load are can be greatly mismatched except for this peak current situation, resulting in a big Ice penalty.

FIGS. 5A-E illustrate an exemplary embodiment of a charge pump system to help reduce this sort of inefficiency. FIG. 5A is a schematic representation of a charge pump system, where similar elements are numbered similarly to those of FIG. 4A (501 versus 401 for the charge pump, and so on). In FIG. 5A, the regulation elements are now used to control the clock frequency, as illustrated the output REG of the comparator COMP 511 now being supplied to the clock generator block CLKGEN 505. This results in the clock period varying with the regulation level, as illustrated schematically in the output of CLKGEN 505 and also the clock driver 509 of the clock driver. (In this embodiment REG is also used to control the VSUP level provided the buffer 509 as in FIG. 4A, but this is optional in the embodiment of FIG. 5A.)

In FIG. 5B ILOAD is again the DC Load current profile, which is the same example as in FIG. 4b, and the line of larger squares is the pump maximum driving strength for the arrangement of FIG. 5A. This closely matches with the load, being a little stronger. At bottom, in FIG. 5E is the clock pump value CLK, showing how this varies with the requirements of the load.

FIG. 5C illustrate the relation of the external supply level VCC and the pump clock supply level VSUP under regulation. There is a relatively minimal voltage drop from VCC to VSUP. This matching of the pump's driving strength to the DC load with minimal voltage drop can allow for significant improvements in efficiency and power savings.

In FIG. 5D, the target VOUT level is compared to the level provided by the system of FIG. 5A. By maintain the pump's output at the target value and dynamically adjusting the clock frequency with full potential clock swing, the system can match pump's driving strength to the DC load.

Figure 6A:
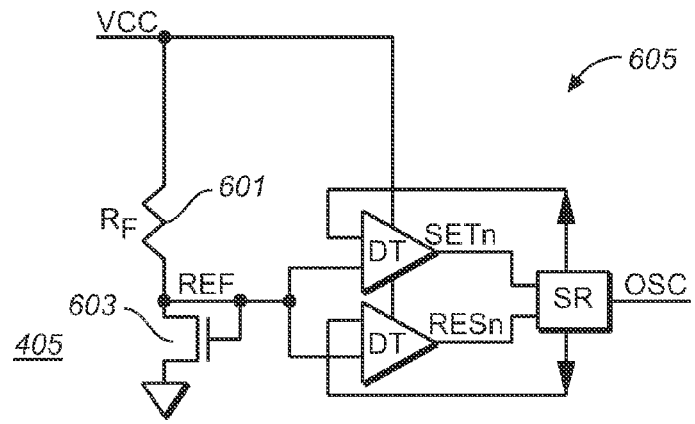
FIGS. 6A and 6B respectively look at the clock generation blocks of FIGS. 4A and 5A in more detail.
Figure 6B:
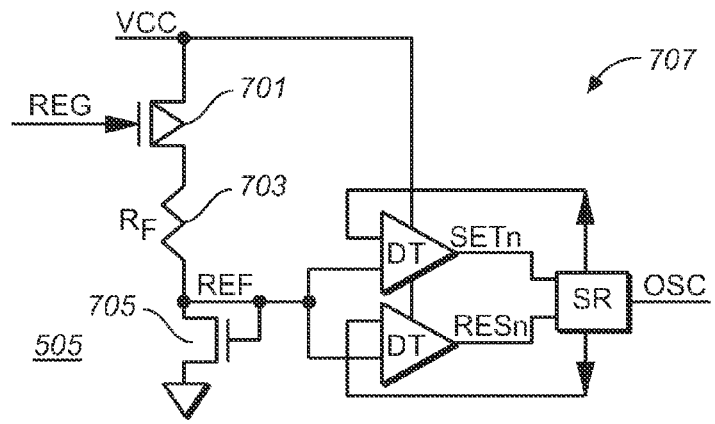

FIGS. 6A and 6B look at an exemplary embodiment of how the clock frequency can be dynamically adjusted based on the VOUT level for the regulation. FIG. 6A is an example for a CLKGEN block 405 as in FIG. 4A. At right is an oscillator circuit 605 whose output frequency OSC depends on an input voltage level REF. Here REF is used as input to the detectors DT that provide the set/reset signals to the flip-flop SR, which in turn outputs OSC as well as the second inputs to the detectors. In this example, the oscillator is a relaxation RC oscillator, but ring oscillators or other circuits could be used. To provide the input voltage, a fixed resistance $R_F$ 601 is connected in series with a diode connected transistor 603 between and ground. The input voltage REF is taken from the node between resistance $R_F$ 601 and diode 603. As REF is fixed, the generated clock frequency OSC is fixed.

Figure 6C:
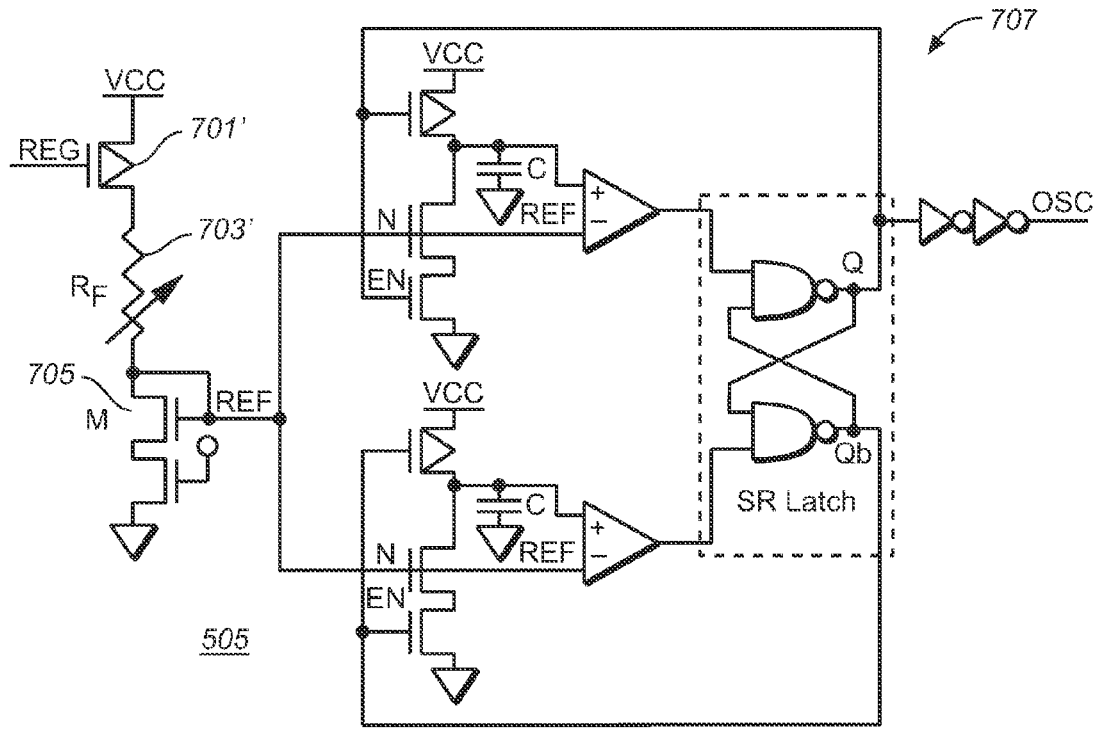
FIG. 6C is a more detailed version of FIG. 6B.

FIG. 6B gives an example of a CLKGEN block 505 such as could be used in FIG. 5A. Instead of a fixed REF value, REF is adjusted by the regulation circuitry to generate a clock frequency to match the pump's ability to drive the DC load it sees. The oscillator 707 is again taken as a relaxation RC oscillator, but ring oscillators or other circuits could be used. The divider circuit used to provide REF now uses the regulation signal REG based on feedback from VOUT to determine the REF level and, hence, the OSC frequency. The node from REF is taken in again connected to ground (or, more generally, the low voltage level) through the diode connected transistor 705. In other embodiments, a resistor could be used. Between VCC and the REF, a variable resistance whose value depends on REG is now included. Here this is implemented by the PMOS 701 whose gate is connected to receive the regulation signal. In this embodiment, a fixed resistance $R_F$ 703 is in series with the variable element. For references, FIG. 6C is a more detailed version of FIG. 6B that includes the capacitances and other elements in more detail. (In FIG. 6C, the resistance $R_F$ 703' is illustrated as variable, indicating that it, or at least a portion of it, is adjustable in order to set the RC constant of the circuit; however, as far as the REG value, this is still a fixed value and does not vary with the regulation level.) Other embodiments could arrange the elements of divider supplying REF differently and use other element, such as an NMOS instead of the PMOS, for example. In this way, the clock frequency CLK for the pump can track the requirements of the load as described in FIGS. 5B-D.

For any of the variations, the arrangement described above can increase power savings and reduce current consumption of the charge pump block. By adjusting the pump clock frequency to regulate pump operations, the pump's maximum driving strength with full clock swing is matched to the pump's DC load for higher efficiency.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A charge pump system, comprising:
    a charge pump circuit connected to receive a clock signal and generate therefrom an output voltage;
    regulation circuitry connected to receive the output voltage and generate a regulation voltage based on the output voltage;
    a clock generation circuit to generate the clock signal, including:
        an oscillator connected to receive a reference voltage and generate therefrom the clock signal, wherein the frequency of the clock signal is dependent upon the level of the reference voltage;
    a reference voltage generating circuit connected to receive the regulation voltage and generate therefrom the reference voltage, wherein the level of the reference voltage is dependent upon the regulation voltage, wherein the reference voltage generating circuit includes:
        a variable resistance element connected between a supply level and an internal node and having a resistance level dependent upon the regulation voltage, wherein the variable resistance includes a transistor whose gate is connected to receive the regulation voltage; and
        a diode connected between the internal node and ground, wherein the reference voltage is taken from the internal node; and
    a clock driver circuit connected to the clock generator to receive the clock signal therefrom and connected to the charge pump circuit to supply the clock signal thereto, wherein the clock driver circuit is connected to a power supply level through a power transistor having a gate connected to the regulation circuitry to receive the regulation voltage.

2. The charge pump system of claim 1, wherein the transistor is a PMOS.

3. The charge pump system of claim 1, wherein the transistor is an NMOS.

4. The charge pump system of claim 1, wherein the variable resistance includes a fixed resistance in series with the transistor.

5. The charge pump system of claim 1, wherein the oscillator is a relaxation oscillator.

6. The charge pump system of claim 1, wherein the oscillator is a ring oscillator.

7. The charge pump system of claim 1, wherein the charge pump circuit is a Dickson type charge pump.

8. The charge pump system of claim 1, wherein the charge pump circuits a voltage doubler type charge pump.

9. The charge pump system of claim 1, wherein the regulation circuitry includes:
    a voltage divider connected between the output voltage and ground; and
    a comparator having a first input connected to a node of the voltage divider, a second input connected to a reference voltage level, and an output supplying the regulation voltage.

10. A charge pump system, comprising:
    a charge pump circuit connected to receive a clock signal and generate therefrom an output voltage;
    regulation circuitry connected to receive the output voltage and generate a regulation voltage based on the output voltage;
    a clock generation circuit to generate the clock signal, including:
        an oscillator connected to receive a reference voltage and generate therefrom the clock signal, wherein the frequency of the clock signal is dependent upon the level of the reference voltage;

a reference voltage generating circuit connected to receive the regulation voltage and generate therefrom the reference voltage, wherein the level of the reference voltage is dependent upon the regulation voltage, wherein the reference voltage generating circuit includes:

a variable resistance element connected between a supply level and an internal node and having a resistance level dependent upon the regulation voltage, wherein the variable resistance includes a transistor whose gate is connected to receive the regulation voltage; and a first fixed resistance connected between the internal node and ground, wherein the reference voltage is taken from the internal node; and a clock driver circuit connected to the clock generator to receive the clock signal therefrom and connected to the charge pump circuit to supply the clock signal thereto, wherein the clock driver circuit is connected to a power supply level through a power transistor having a gate connected to the regulation circuitry to receive the regulation voltage.

11. The charge pump system of claim 10, wherein the transistor is a PMOS.

12. The charge pump system of claim 10, wherein the transistor is an NMOS.

13. The charge pump system of claim 10, wherein the variable resistance includes a second fixed resistance in series with the transistor.

14. The charge pump system of claim 10, wherein the oscillator is a relaxation oscillator.

15. The charge pump system of claim 10, wherein the oscillator is a ring oscillator.

16. The charge pump system of claim 10, wherein the charge pump circuit is a Dickson type charge pump.

17. The charge pump system of claim 10, wherein the charge pump circuits a voltage doubler type charge pump.

18. The charge pump system of claim 10, wherein the regulation circuitry includes:

a voltage divider connected between the output voltage and ground; and a comparator having a first input connected to a node of the voltage divider, a second input connected to a reference voltage level, and an output supplying the regulation voltage.

* * * * *